United States Patent
Jang et al.

(10) Patent No.: US 7,879,720 B2
(45) Date of Patent: Feb. 1, 2011

(54) METHODS OF FORMING ELECTRICAL INTERCONNECTS USING ELECTROLESS PLATING TECHNIQUES THAT INHIBIT VOID FORMATION

(75) Inventors: Woo Jin Jang, Fishkill, NY (US); Sung Dong Cho, Fishkill, NY (US); Hyung Woo Kim, Fishkill, NY (US); Bum Ki Moon, LaGrangeville, NY (US)

(73) Assignees: Samsung Electronics Co., Ltd. (KR); Infineon Technologies AG (DE)

( * ) Notice: Subject to any disclaimer, the term of this patent is extended or adjusted under 35 U.S.C. 154(b) by 144 days.

(21) Appl. No.: 12/241,744

(22) Filed: Sep. 30, 2008

(65) Prior Publication Data

US 2010/0081272 A1   Apr. 1, 2010

(51) Int. Cl.
*H01L 23/52* (2006.01)
*H01L 21/768* (2006.01)

(52) U.S. Cl. .................. 438/640; 438/597; 438/678; 257/E21.575; 257/E21.578

(58) Field of Classification Search ............. 438/597, 438/618, 622, 624, 637, 638, 639, 640, 678; 257/E21.575, E21.577, E21.578, E21.584
See application file for complete search history.

(56) References Cited

U.S. PATENT DOCUMENTS 6,319,797 B1 * 11/2001 Usami ..................... 438/510
6,380,065 B1   4/2002 Komai et al.
6,395,627 B1   5/2002 Hoshino et al.
2005/0059258 A1 * 3/2005 Edelstein et al. ............ 438/758
2008/0026569 A1   1/2008 Cohen
2008/0142971 A1   6/2008 Dordi et al.
2008/0160204 A1   7/2008 Lavoie et al.
2008/0160688 A1   7/2008 Pan
2008/0176395 A1   7/2008 Cunningham
2008/0182406 A1   7/2008 Preusse et al.

FOREIGN PATENT DOCUMENTS

KR        2005056383 A  *  6/2005
KR    1020050056383 A       6/2005

* cited by examiner

*Primary Examiner*—Matthew S Smith
*Assistant Examiner*—Michele Fan
(74) *Attorney, Agent, or Firm*—Myers Bigel Sibley & Sajovec

(57) ABSTRACT

Methods of forming electrical interconnects include forming a copper pattern on a semiconductor substrate and then forming an electrically insulating capping layer on the copper pattern and an interlayer insulating layer on the electrically insulating capping layer. A contact hole is then formed, which extends through the interlayer insulating layer and the electrically insulating capping layer and exposes an upper surface of the copper pattern. An electroless plating step is then performed to form a copper pattern extension onto the exposed upper surface of the copper pattern. The copper pattern extension may have a thickness that is less than a thickness of the electrically insulating capping layer, which may be formed as a SiCN layer.

18 Claims, 5 Drawing Sheets

METHODS OF FORMING ELECTRICAL INTERCONNECTS USING ELECTROLESS PLATING TECHNIQUES THAT INHIBIT VOID FORMATION

FIELD OF THE INVENTION

The present invention relates to methods of forming integrated circuit devices and, more particularly, to methods of forming electrical interconnects on integrated circuit substrates.

BACKGROUND OF THE INVENTION

Methods of forming integrated circuit devices frequently include techniques to form multiple layers of metallization on an integrated circuit substrate. These techniques may also include damascene and other techniques to form metal interconnects that extend between the multiple layer of metallization. Some of these techniques to form metal interconnects, which utilize electroless plating techniques, are disclosed in U.S. Pat. No. 6,380,065 to Komai et al., entitled "Interconnection Structure and Fabrication Process Therefor," and U.S. Pat. No. 6,395,627 to Hoshino et al., entitled "Semiconductor Device, A Buried Wiring Structure and Process for Fabricating the Same." In particular, the '065 patent to Komai et al. discloses reducing an aspect ratio of a contact hole by depositing copper into the contact hole using an electroless plating method and a lower copper interconnect as a catalyst. The '627 patent to Hoshino et al. discloses using electroless plating to completely fill a via hole with a metal plug. Additional techniques to form metal interconnects utilize chemical mechanical polishing techniques and metal seed layers to define dual damascene patterns. One of these techniques is disclosed by Korean Patent Publication No. 20050056383 to Min, entitled "Method of Forming Metal Line of Semiconductor Device Without Protrusion of Metal Plating Layer."

SUMMARY OF THE INVENTION

Methods of forming electrical interconnects according to embodiments of the present invention include forming a copper pattern on a semiconductor substrate and then forming an electrically insulating capping layer on the copper pattern and an interlayer insulating layer on the electrically insulating capping layer. A contact hole is then formed. The contact hole extends through the interlayer insulating layer and the electrically insulating capping layer and exposes an upper surface of the copper pattern. An electroless plating step is then performed to form a copper pattern extension onto the exposed upper surface of the copper pattern. The copper pattern extension may have a thickness that is less than a thickness of the electrically insulating capping layer, which may be formed as a SiCN layer.

According to some of these embodiments of the invention, the electroless plating step may be preceded by the steps of depositing a first barrier metal layer onto a sidewall of the contact hole and onto the exposed upper surface of the copper pattern, and then selectively etching back a portion of the first barrier metal layer to thereby expose the upper surface of the copper pattern. This step of selectively etching back a portion of the first barrier metal layer may be followed by the steps of depositing a second barrier metal layer onto the exposed upper surface of the copper pattern extension, and then electroplating a copper interconnect into the contact hole by depositing a copper seed layer onto the second barrier metal layer and then using the copper seed layer as a plating electrode.

According to still further embodiments of the invention, the step of electroless plating may be followed by the steps of depositing a barrier metal layer onto a sidewall of the contact hole and onto the copper pattern extension, and then electroplating a copper interconnect into the contact hole, using a deposited copper seed layer as a plating electrode. In addition, a portion of the interlayer insulating layer extending adjacent the electrically insulating capping layer may have a nonuniform material composition. Moreover, the step of forming a contact hole may include forming a contact hole having a non-uniform width therein with a constricted neck extending adjacent an interface between the electrically insulating capping layer and the interlayer insulating layer. According to these embodiments of the invention, the portion of the interlayer insulating layer extending adjacent the electrically insulating capping layer may be a graded oxide layer.

Methods of forming electrical interconnects according to additional embodiments of the invention include forming a copper pattern on a semiconductor substrate and forming an electrically insulating capping layer comprising a first material (e.g., SiCN), on the copper pattern. An interlayer insulating layer, which is formed of a second material different from the first material, is formed on the electrically insulating capping layer. A contact hole is then formed that extends through the interlayer insulating layer and the electrically insulating capping layer and exposes an upper surface of the copper pattern. An electroless plating step is then performed to plate a metal extension onto the exposed upper surface of the copper pattern. This metal extension, which may include a metal such as copper or cobalt (e.g., CoW, CoWP, CoWPB and CoWB), may have a thickness that is less than a thickness of the electrically insulating capping layer.

According to further aspects of these embodiments, the step of electroless plating is preceded by the steps of depositing a first barrier metal layer onto a sidewall of the contact hole and onto the exposed upper surface of the copper pattern, and then selectively etching back a portion of the first barrier metal layer to thereby expose the upper surface of the copper pattern. This step of selectively etching back a portion of the first barrier metal layer may be followed by the steps of depositing a second barrier metal layer onto the exposed upper surface of the metal extension, and then electroplating a copper interconnect into the contact hole, using a deposited copper seed layer as a plating electrode.

DETAILED DESCRIPTION OF PREFERRED EMBODIMENTS

Figure 1:
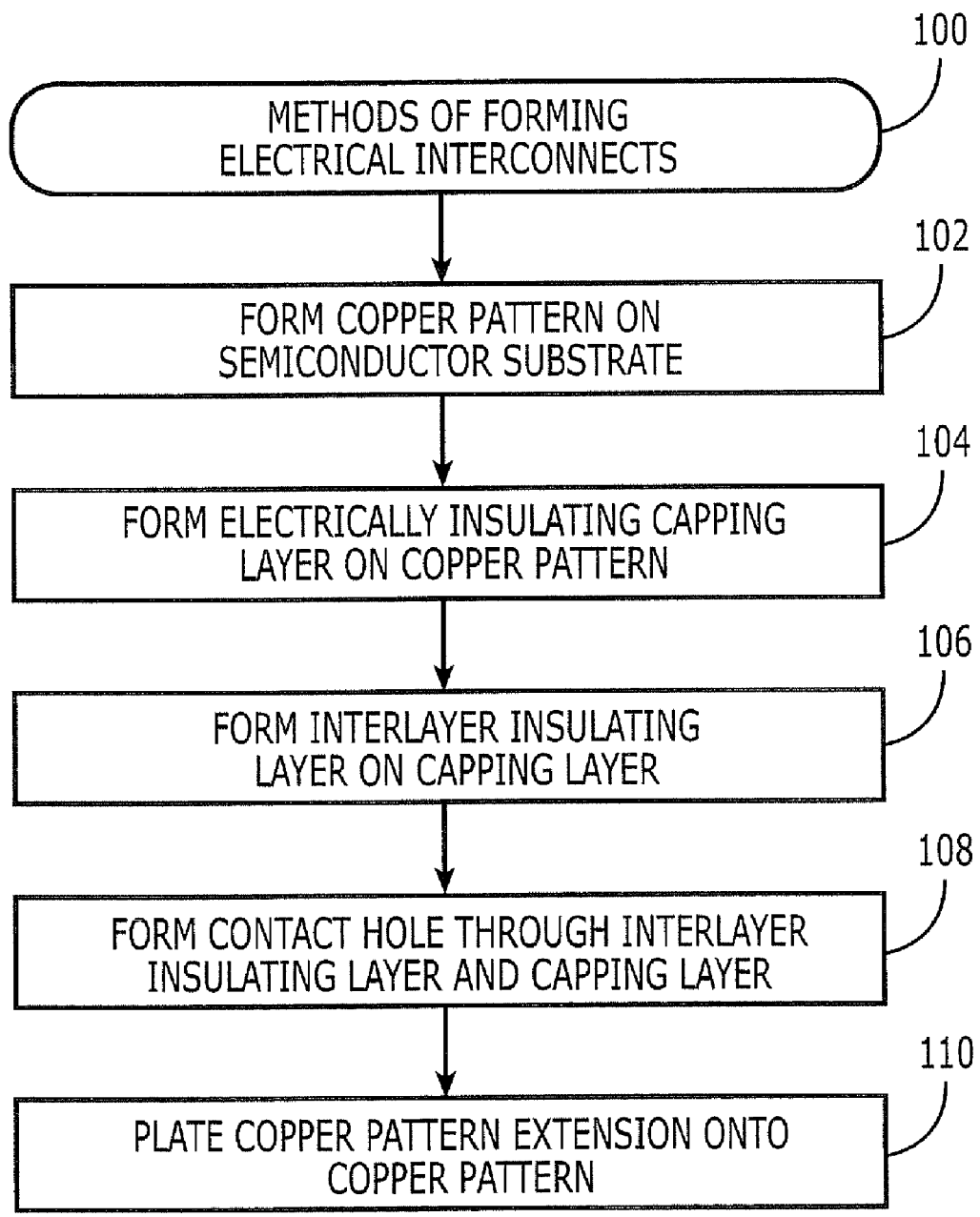
FIG. 1 is a flow diagram of steps that illustrate methods of forming electrical interconnects according to embodiments of the present invention.

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Referring now to the flow diagram of FIG. 1, methods of forming electrical interconnects 100 according to some embodiments of the present invention include forming a copper pattern on a semiconductor substrate, Block 102, and then forming an electrically insulating capping layer on the copper pattern, Block 104. This capping layer may be formed as a SiCN layer. An interlayer insulating layer is then formed on the electrically insulating capping layer, Block 106. A step is also performed to define a contact hole, which extends through the interlayer insulating layer and the electrically insulating capping layer and exposes an upper surface of the copper pattern, Block 108. An electroless plating step is then performed to form a copper pattern extension onto the exposed upper surface of the copper pattern, Block 110. The copper pattern extension is typically and preferably formed to have a thickness less than a thickness of the electrically insulating capping layer.

Figure 2:
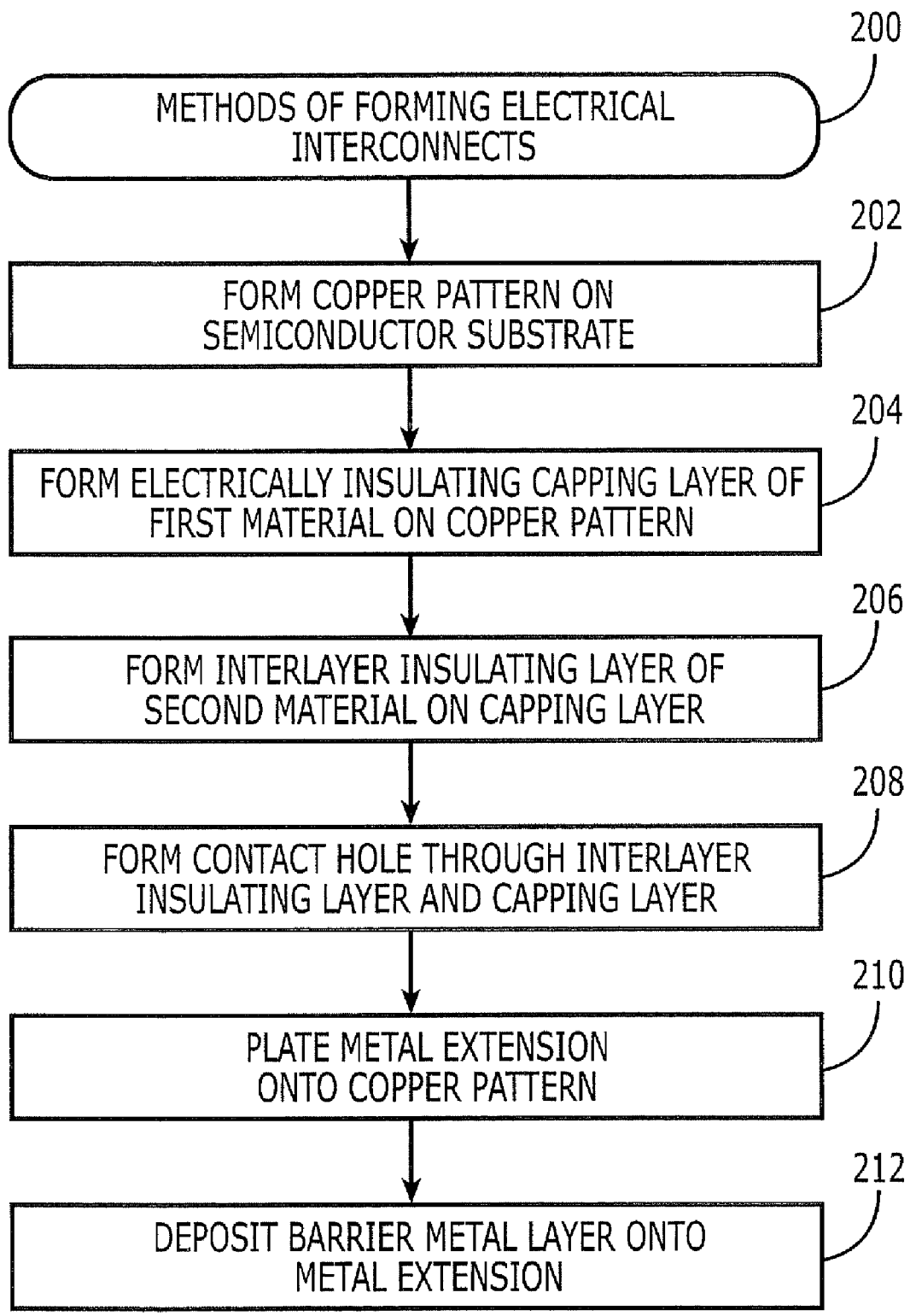
FIG. 2 is a flow diagram of steps that illustrate methods of forming electrical interconnects according to embodiments of the present invention.
Figure 4A:
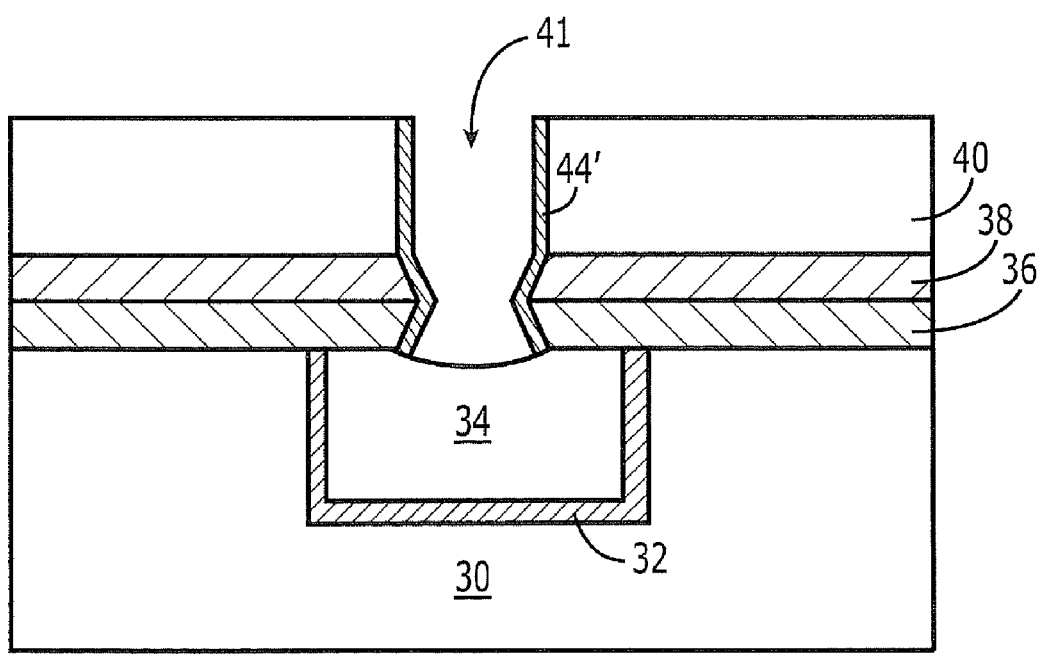
FIGS. 4A-4C are cross-sectional views of intermediate structures that illustrate methods of forming electrical interconnects according to embodiments of the present invention.

Methods of forming electrical interconnects 200 according to additional embodiments of the invention are illustrated by the flow diagram of FIG. 2 of the application. These methods include forming a patterned copper layer on a semiconductor substrate, Block 202, and then forming an electrically insulating capping layer of a first material on the patterned copper layer, Block 204. An interlayer insulating layer of a second material is then formed on the capping layer, Block 206. The first and second materials may be different electrically insulating materials. Steps are then performed to form a contact hole that extends through the interlayer insulating layer and the capping layer and exposes an upper surface of the patterned copper layer, Block 208. A metal extension containing copper or cobalt (Co) is then plated onto a portion of the upper surface of the patterned copper layer that is exposed by the contact hole, Block 210. A barrier metal layer is then deposited into the contact hole and onto the metal extension, Block 212. Moreover, as illustrated by FIG. 4A, the step of forming the metal extension, Block 210, may be preceded by a step of depositing a barrier metal layer that lines the contact hole and then selectively etching back the deposited barrier metal layer to thereby expose the upper surface of the patterned copper layer.

Figure 3A:
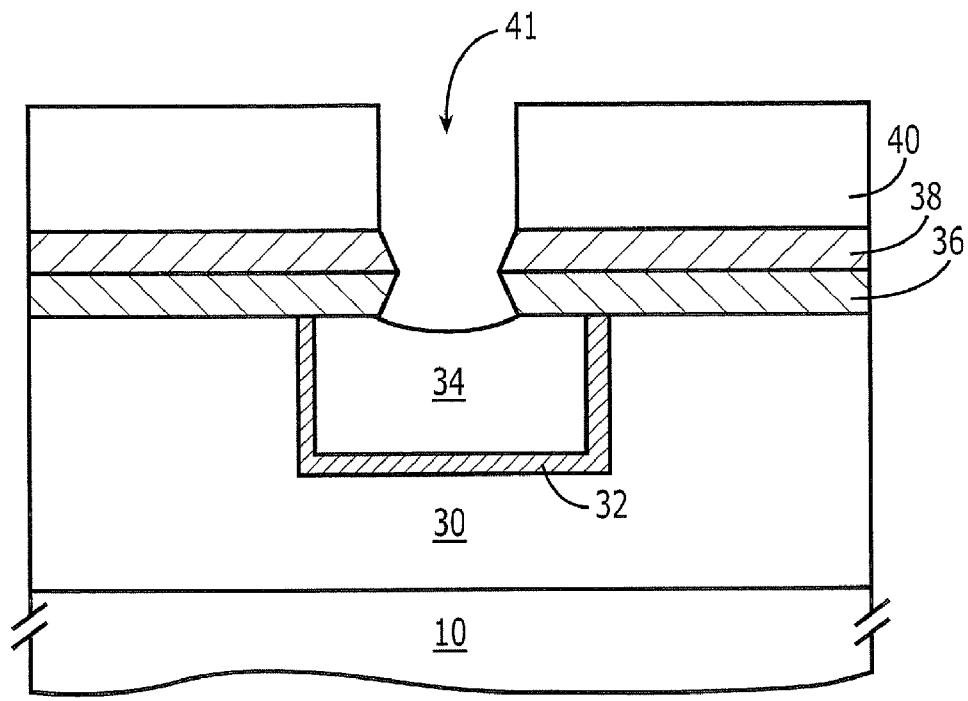
FIGS. 3A-3C are cross-sectional views of intermediate structures that illustrate methods of forming electrical interconnects according to embodiments of the present invention.

According to further embodiments of the invention, the methods illustrated by the flow diagrams of FIGS. 1-2 may include forming an underlying electrically insulating layer 30 on an integrated circuit substrate 10, as illustrated by FIG. 3A. This integrated circuit substrate 10 may include a semiconductor substrate, for example. The underlying electrically insulating layer 30 may be formed as a relatively thick silicon dioxide layer that is deposited on a semiconductor substrate having active devices (e.g., transistors) therein. Conventional damascene processing techniques may be performed to define a copper pattern 34 in the underlying electrically insulating layer 30. These techniques may include forming a recess within an upper surface of the electrically insulating layer 30 and lining the bottoms and sidewalls of the recess with a barrier metal layer 32, which operates as a copper diffusion barrier.

Referring still to FIG. 3A, an electrically insulating capping layer 36 is formed on the upper surface of the underlying electrically insulating layer 30 and on an upper surface of the copper pattern 34. According to some embodiments of the invention, the capping layer 36 may be a SiCN layer having a thickness in a range from about 50 Å to about 1000 Å. An interlayer insulating layer is then formed on the electrically insulating capping layer 36. As illustrated, this interlayer insulating layer may be a composite insulating layer having a nonuniform composition. For example, the interlayer insulating layer may include a graded oxide layer 38 directly on an upper surface of the capping layer 36 and a relatively low dielectric constant insulating layer 40 (e.g., octamethycyclotetrasiloxane (OMCTS), p-SiCOH) on the graded oxide layer 38. A contact/via hole 41 is then formed that extends through the interlayer insulating layer (40, 38) and the electrically insulating capping layer 36 and exposes an upper surface of the copper pattern 34. The contact hole formation process may include selectively etching the interlayer insulating layer and the capping layer 36 in sequence, using the copper pattern 34 as an etch stop layer. As shown, the non-uniformity of the composition of the interlayer insulating layer may cause the contact hole to have a non-uniform width, with a constricted neck extending adjacent an interface between the electrically insulating capping layer 36 and the graded oxide layer 38.

Figure 3B:
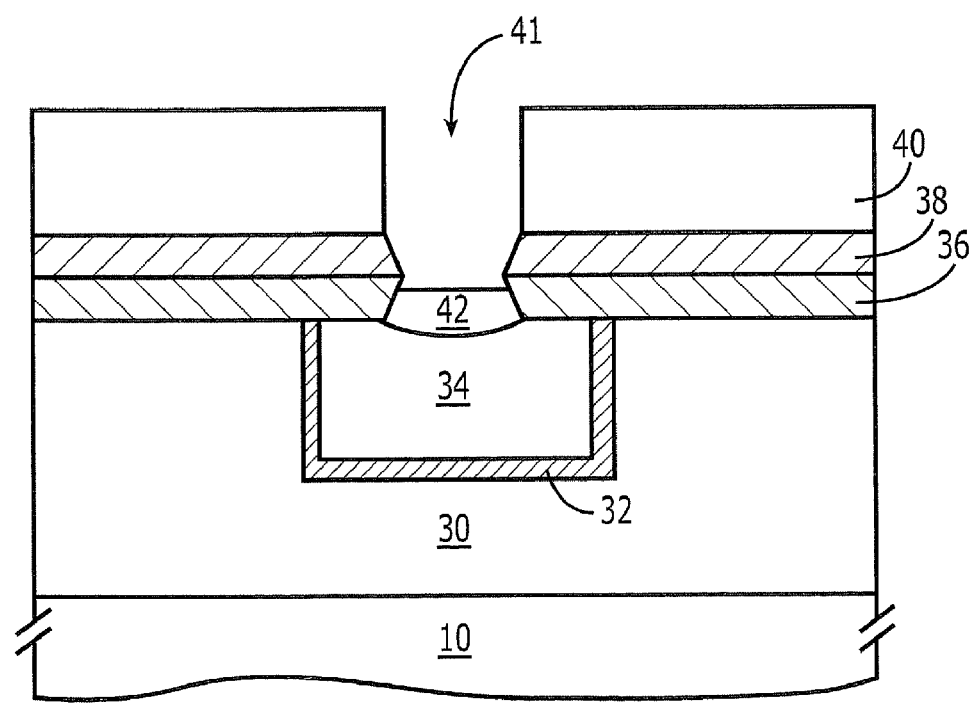

Referring now to FIG. 3B, a step is performed to form a copper pattern extension 42 (i.e., metal extension) onto the exposed upper surface of the copper pattern 34 using, for example, an electroless plating technique. As illustrated, the copper pattern extension 42 is preferably formed to have a thickness less than a thickness of the electrically insulating capping layer 36, however, in some alternative embodiments of the invention, the copper pattern extension 42 may have the same thickness as the insulating capping layer 36. The copper pattern extension 42 may be formed of a material selected from a group consisting of copper (Cu), CoW, CoWP, CoWPB and CoWB.

Figure 3C:
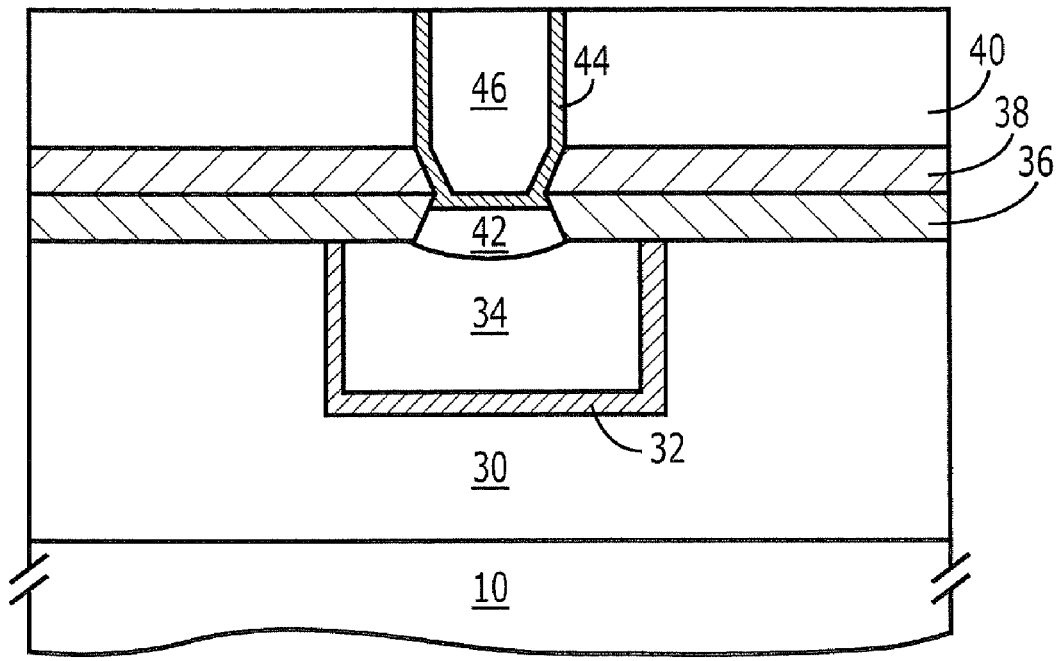

Thereafter, as illustrated by FIG. 3C, the step of electroless plating is followed by depositing a barrier metal layer 44 onto a sidewall of the contact hole 41 and onto the copper pattern extension 42. A copper interconnect 46 is then electroplated into the contact hole. This electroplating step may include depositing a thin copper seed layer (e.g., by CVD or PVD) into the contact hole (and onto the barrier metal layer 44) and then using the thin copper seed layer as a plating electrode. The barrier metal layer 44 may include a metal selected from a group consisting of TaN—Ta, TiN—Ti, TiSiN, TaN—Ta—Ru, TaSiN and Ta—Ti—N. This barrier metal layer 44 may have a thickness in a range from about 10 Å to about 100 Å.

A planarization step may then be performed, if necessary, to remove the barrier metal layer 44 from an upper surface of the insulating layer 40 and define the resulting electrical interconnect (42, 44 and 46). Thereafter, additional interconnects, metallization layers, and passivation may be formed on the substrate of FIG. 3C along with additional back-end fabrication processes (not shown).

Figure 4B:
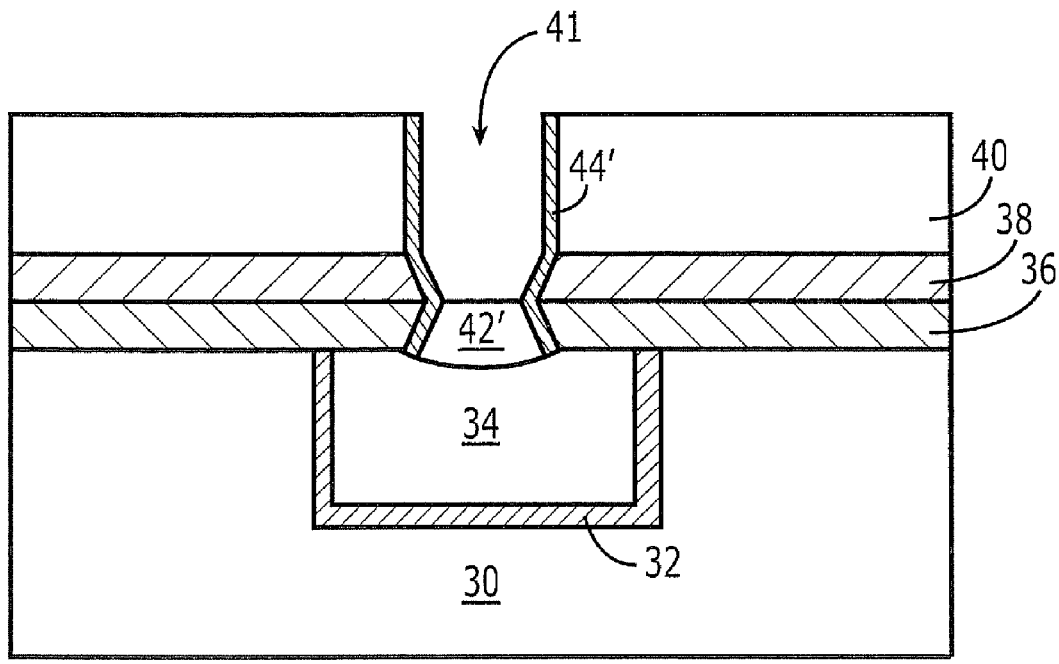
Figure 4C:
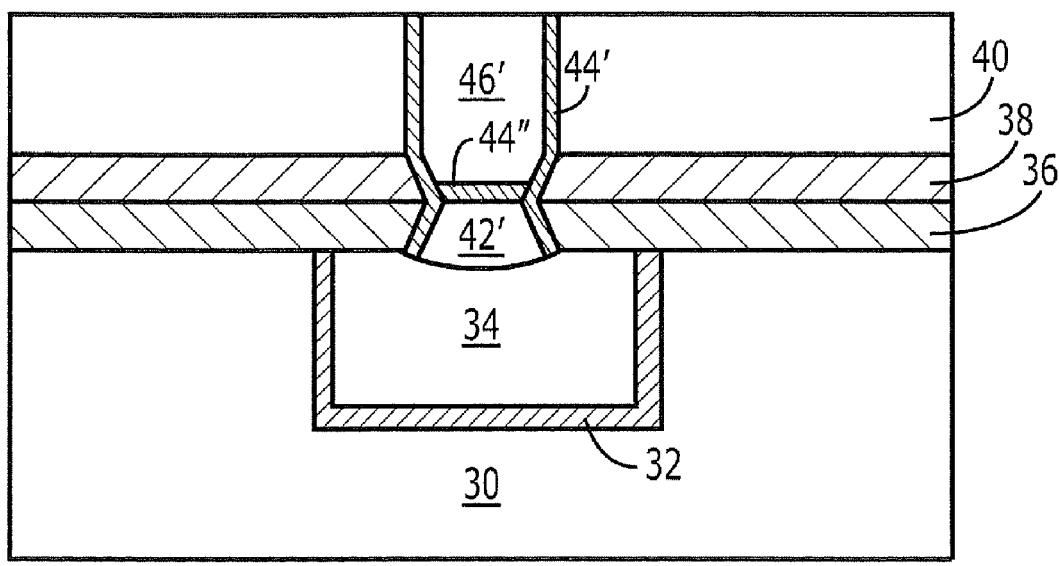

Referring now to FIGS. 4A-4C, additional methods of forming electrical interconnects according to embodiments of the present invention, include forming an underlying electrically insulating layer 30 on an integrated circuit substrate 10, as illustrated by FIG. 4A. Conventional damascene processing techniques may then be performed to define a copper pattern 34 in the underlying electrically insulating layer 30. These techniques may include forming a recess within an upper surface of the electrically insulating layer 30 and then lining the bottoms and sidewalls of the recess with a barrier metal layer 32, which operates as a copper diffusion barrier. An electrically insulating capping layer 36 is then formed the upper surface of the underlying electrically insulating layer 30 and an upper surface of the copper pattern 34. This capping layer 36 may be a SiCN layer.

An interlayer insulating layer is formed on the electrically insulating capping layer 36. This interlayer insulating layer may be a composite insulating layer. In particular, the interlayer insulating layer may include a graded oxide layer 38 directly on an upper surface of the capping layer 36 and a relatively low dielectric constant insulating layer 40 on the graded oxide layer 38. A contact/via hole 41 is then formed that extends through the interlayer insulating layer (40, 38) and the electrically insulating capping layer 36 and exposes an upper surface of the copper pattern 34. The contact hole formation process may include selectively etching the interlayer insulating layer and the capping layer 36 in sequence, using the copper pattern 34 as an etch stop layer. As shown, the nonuniformity of composition of the interlayer insulating layer may cause the contact hole to have a non-uniform width, with a constricted neck extending adjacent an interface between the electrically insulating capping layer 36 and the graded oxide layer 38.

A first barrier metal layer is then deposited onto a sidewall of the contact hole 41 and onto the exposed upper surface of the copper pattern 34. This first barrier metal layer, which may include a metal selected from a group consisting of TaN—Ta, TiN—Ti, TiSiN, TaN—Ta—Ru, TaSiN and Ta—Ti—N, may have a thickness in a range from about 10 Å to about 100 Å. A portion of the first barrier metal layer is then selectively etched to thereby expose the upper surface of the copper pattern 34 and define a first barrier metal layer 44' on sidewalls of the contact hole 41.

Referring now to FIG. 4B, a step is performed to form a copper pattern extension 42' (i.e., metal extension) on the exposed upper surface of the copper pattern 34 using, for example, an electroless plating technique. As illustrated, the copper pattern extension 42' is preferably formed to have a thickness less than a thickness of the electrically insulating capping layer 36. The copper pattern extension 42 may be formed of a material selected from a group consisting of copper (Cu), CoW, CpWP, CoWPB and CoWB, for example.

Thereafter, as illustrated by FIG. 4C, a second barrier metal layer 44" is deposited onto the exposed upper surface of the copper pattern extension 42'. This second barrier metal layer 44" may include a metal selected from a group consisting of TaN—Ta, TiN—Ti, TiSiN, TaN—Ta—Ru, TaSiN and Ta—Ti—N. A copper interconnect 46' is then electroplated into the contact hole 41, using a deposited copper seed layer as a plating electrode. Thereafter, additional interconnects, metallization layers, and passivation may be formed on the substrate of FIG. 4C along with additional back-end fabrication processes (not shown).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrical interconnect, comprising:
   forming a copper pattern on a semiconductor substrate;
   forming an electrically insulating capping layer on the copper pattern;
   forming an interlayer insulating layer on the electrically insulating capping layer;
   forming a contact hole that extends through the interlayer insulating layer and the electrically insulating capping layer and exposes an upper surface of the copper pattern; and
   electroless plating a copper pattern extension onto the exposed upper surface of the copper pattern;
   wherein a portion of the interlayer insulating layer extending adjacent the electrically insulating capping layer has a nonuniform composition; wherein forming a contact hole comprises forming a contact hole having a non-uniform width therein with a constricted neck at an interface between the electrically insulating capping layer and the interlayer insulating layer; and wherein a minimum width of the non-uniformly wide contact hole in the electrically insulating capping layer is at the interface.

2. The method of claim 1, wherein a thickness of the copper pattern extension is less than a thickness of the electrically insulating capping layer.

3. The method of claim 2, wherein the electrically insulating capping layer comprises SiCN.

4. The method of claim 1, wherein the electrically insulating capping layer comprises SiCN.

5. The method of claim 1, wherein said electroless plating is preceded by:
   depositing a first barrier metal layer onto a sidewall of the contact hole and onto the exposed upper surface of the copper pattern; and
   selectively etching back a portion of the first barrier metal layer to thereby expose the upper surface of the copper pattern.

6. The method of claim 5, wherein selectively etching back a portion of the first barrier metal layer is followed by:
   depositing a second barrier metal layer onto the exposed upper surface of the copper pattern extension; and
   electroplating a copper interconnect into the contact hole.

7. The method of claim 1, wherein said electroless plating is followed by:
   depositing a barrier metal layer onto a sidewall of the contact hole and onto the copper pattern extension; and
   electroplating a copper interconnect into the contact hole.

8. The method of claim 1, wherein the portion of the interlayer insulating layer extending adjacent the electrically insulating capping layer is a graded oxide layer.

9. A method of forming an electrical interconnect, comprising:
   forming a copper pattern on a semiconductor substrate;
   forming an electrically insulating capping layer comprising a first material, on the copper pattern;
   forming an interlayer insulating layer comprising a second material different from the first material, on the electrically insulating capping layer;
   forming a contact hole that extends through the interlayer insulating layer and the electrically insulating capping layer and exposes an upper surface of the copper pattern; and
   electroless plating a metal extension onto the exposed upper surface of the copper pattern;
   wherein a portion of the interlayer insulating layer extending adjacent the electrically insulating capping layer has a nonuniform composition; wherein forming a contact hole comprises forming a contact hole having a non-uniform width therein with a constricted neck at an interface between the electrically insulating capping layer and the interlayer insulating layer; and wherein a minimum width of the non-uniformly wide contact hole in the electrically insulating capping layer is at the interface.

10. The method of claim 9, wherein the metal extension comprises a metal selected from a group consisting of copper and cobalt.

11. The method of claim 10, wherein a thickness of the metal extension is less than a thickness of the electrically insulating capping layer.

12. The method of claim 11, wherein the electrically insulating capping layer comprises SiCN.

13. The method of claim 10, wherein the metal extension comprises a material selected from a group consisting of copper, CoW, CoWP, CoWPB and CoWB.

14. The method of claim 9, wherein the electrically insulating capping layer comprises SiCN.

15. The method of claim 9, wherein said electroless plating is preceded by:
- depositing a first barrier metal layer onto a sidewall of the contact hole and onto the exposed upper surface of the copper pattern; and
- selectively etching back a portion of the first barrier metal layer to thereby expose the upper surface of the copper pattern.

16. The method of claim 15, wherein selectively etching back a portion of the first barrier metal layer is followed by:
- depositing a second barrier metal layer onto the exposed upper surface of the metal extension; and
- electroplating a copper interconnect into the contact hole.

17. The method of claim 9, wherein said electroless plating is followed by:
- depositing a barrier metal layer onto a sidewall of the contact hole and onto the metal extension; and
- electroplating a copper interconnect into the contact hole.

18. The method of claim 9, wherein the portion of the interlayer insulating layer extending adjacent the electrically insulating capping layer is a graded oxide layer.

* * * * *